United States Patent
Chao

[19]

[11] Patent Number: 5,817,568
[45] Date of Patent: Oct. 6, 1998

[54] METHOD OF FORMING A TRENCH ISOLATION REGION

[75] Inventor: Shun-Haw Chao, Hsinchu, Taiwan

[73] Assignee: Winbond Electronics Corp., Hsinchu, Taiwan

[21] Appl. No.: 884,506

[22] Filed: Jun. 27, 1997

[30] Foreign Application Priority Data

Apr. 15, 1997 [TW] Taiwan ................................. 86104852

[51] Int. Cl.⁶ .................................................. H01L 21/76
[52] U.S. Cl. ......................... 438/427; 438/424; 438/428; 148/DIG. 50
[58] Field of Search .................................... 438/427, 424, 438/428, 435; 148/DIG. 50

[56] References Cited

U.S. PATENT DOCUMENTS

| 5,340,755 | 8/1994 | Zwicknagl et al. | 438/427 |
| 5,397,731 | 3/1995 | Takemura | 438/427 |
| 5,536,675 | 7/1996 | Bohr | 438/427 |
| 5,646,063 | 7/1997 | Mehta et al. | 438/427 |
| 5,702,977 | 12/1997 | Jang et al. | 438/427 |

*Primary Examiner*—Trung Dang
*Attorney, Agent, or Firm*—Rabin & Champagne, P.C.

[57] ABSTRACT

A method, using multi-trench formation techniques, to define the respective depths of trenches having different widths. The method includes forming a buffer oxide layer and a polishing stop layer, in sequence, above a semiconductor substrate. Then, the buffer oxide layer, the polishing stop layer and the semiconductor substrate are defined to form at least one narrow trench. Thereafter, the buffer oxide layer, the polishing stop layer and the semiconductor substrate are again defined to form at least one wide trench whose depth is less than that of the narrow trench. Alternatively, the wide trench may be etch-defined first, followed by the narrow trench. However, in both cases the depth of the wide trench will be less than that of the narrow trench. Subsequently, an oxide layer is formed, which fills the narrow and wide trenches. Next, a portion of the oxide layer and a portion of the polishing stop layer are removed to form a planarized surface. Finally, the polishing stop layer and the buffer oxide layer are removed.

29 Claims, 5 Drawing Sheets

METHOD OF FORMING A TRENCH ISOLATION REGION

BACKGROUND OF THE INVENTION

1. Field of Invention

This invention relates in general to a method of forming a trench isolation region. More particularly, this invention relates to a method of forming a trench isolation region that uses a multi-trench formation technique.

2. Description of Related Art

The use of trench isolation regions in the production of very large scale integration (VLSI) circuits is becoming more common. For example, this isolation technique is now used in a variety of new generation metal-oxide-semiconductor (MOS) components, and replaces the conventional LOCOS (local oxidation) methods, so as to lower the spatial requirements of the isolation region, thus raising the level of component integration.

Trench isolation regions are conventionally formed by first anisotropic dry etching the areas between the MOS components so as to dig trenches. Thereafter, the trenches are back filled with an insulating material, such as silicon dioxide, to obtain an effective isolation region.

However, to overcome various known problems, such as junction isolation and latch-up, the depth of most trench isolation regions needs to be relatively great (for example, about 0.7 $\mu$m). As a result, when the trenches are filled with the insulating material, wider trenches will have the insulating material projecting thereabove to a step height which is less than a step height for narrower trenches. After performing a planarization operation (using, for example, a chemical-mechanical polishing (CMP) method), a dish-shaped pit will often be formed in the surfaces of the wider trenches, so that the surfaces will not be smooth and planar. This is known as the dishing effect. To better explain this dishing phenomenon, reference is made to FIGS. 1A through 1E.

FIGS. 1A through 1E are cross-sectional views of the conventional manufacturing operations for forming trench isolation regions. Referring first to FIG. 1A, a buffer oxide layer 102 and a polishing stop layer 104 are formed in sequence above a semiconductor substrate 100. Then, a mask oxide layer 106 is deposited above the polishing stop layer 104. Mask oxide layer 106 serves as an etching mask.

Referring next to FIG. 1B, photolithographic and etching processes are used to form a patterned photoresist layer 108. Then, mask oxide layer 106 and polishing stop layer 104 are defined to form a plurality of openings. The plurality of openings includes at least one narrow opening 101, and at least one wide opening 103, with the width of the wide opening 103 being greater than 10 $\mu$m.

Referring next to FIG. 1C, using the photoresist layer 108 and the mask oxide layer 106 as an etching mask, the buffer oxide layer 102 and the semiconductor substrate 100 are defined through openings 101 and 103 (as shown in FIG. 1B). This forms at least one narrow trench 105 and at least one wide trench 107 in the semiconductor substrate 100. The trenches have a depth which is greater than 0.6 $\mu$m, for example, about 0.7 $\mu$m.

Referring to FIG. 1D, the photoresist layer 108 and the mask oxide layer 106 are removed. Then, an oxide layer 110 is deposited, which fills the narrow trench 105 and the wide trench 107. However, as noted above, the oxide layer 110 above the wide trench 107 will likely have a pit 109 formed therein. Stated alternatively, the oxide layer 110 above the wide trench 107 will have a lower step height than the oxide layer above the narrow trench 105.

Referring next to FIG. 1E, a portion of the oxide layer 110 and the polishing stop layer 104 are removed in a planarization operation, using CMP. Then, any residual portion of the polishing stop layer 104, and the buffer oxide layer 102, are removed to complete the formation of the trench isolation region. Due to the presence of pit 109, after the CMP operation is performed, a non-planar dish-shaped pit is similarly formed on the surface 110a.

Conventional techniques for improving the dishing problem after CMP is performed, include depositing a very thick insulating layer. However, as the thickness of the deposited layer is increased, the effect of micro-particles in a reaction chamber will become dominant. Hence, to reduce the problem of micro-particle pollution, the insulating layer can be deposited in two separate, first and second operations. Chamber plasma cleaning and wafer wet cleaning processes may be performed between the first and the second depositing operations, which effectively controls micro-particles. However, such additional processing operations will increase production time and lower productivity. Moreover, the uniformity of the insulating layer will be compromised due to the increase in its thickness.

SUMMARY OF THE INVENTION

It is therefore an object of this invention to provide a method of forming a trench isolation region that prevents the occurrence of dishing.

It is yet another object of the present invention to provide a method of forming a trench isolation region, which lowers the thickness requirement of the insulating layer, reduces pollution caused by micro-particles, and increases the uniformity of the deposited layer.

Furthermore, it is another object of the present invention to provide a method of forming a trench isolation region in which productivity is increased through the elimination of two separate steps for the deposition of the insulating layer.

To achieve the above and other objects, a method, using multi-trench formation techniques, is performed to define the respective depths of the trenches having different widths. The method includes forming a buffer oxide layer and a polishing stop layer, in sequence, above a semiconductor substrate. Then, the buffer oxide layer, the polishing stop layer and the semiconductor substrate are defined to form at least one narrow trench. Thereafter, the buffer oxide layer, the polishing stop layer and the semiconductor substrate are again defined to form at least one wide trench whose depth is less than that of the narrow trench. Alternatively, the wide trench may be etch-defined first, followed by etch-defining of the narrow trench. However, in both cases the depth of the wide trench will be less than that of the narrow trench. Subsequently, an oxide layer is formed, which fills the narrow and wide trenches. Next, a portion of the oxide layer and a portion of the polishing stop layer are removed to form a planarized surface. Finally, the polishing stop layer and the buffer oxide layer are removed.

BRIEF DESCRIPTION OF THE DRAWINGS

Other objects, features, and advantages of the invention will become apparent from the following detailed description of the preferred but non-limiting embodiments. The description is made with reference to the accompanying drawings, in which.

DESCRIPTION OF THE PREFERRED EMBODIMENT

Figure 2A:
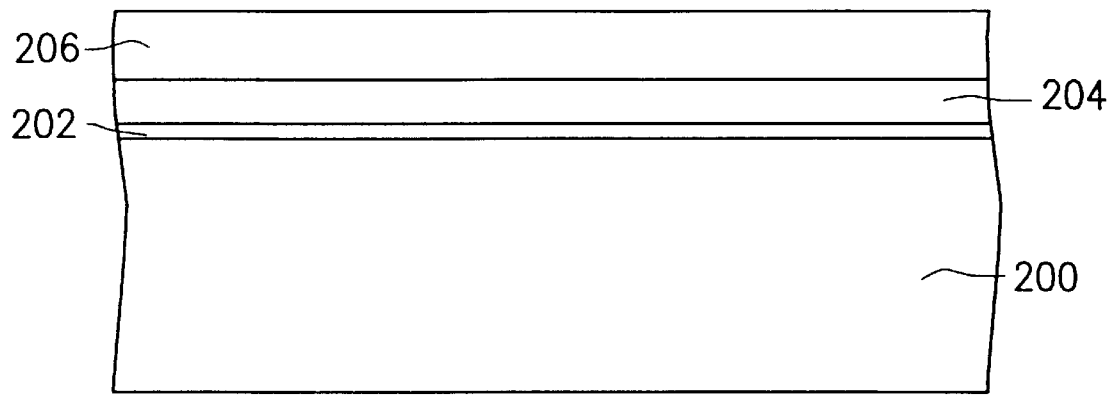
FIGS. 2A through 2G are cross-sectional views of a process for forming a trench isolation region, according to this invention.

Referring to FIG. 2A, a buffer oxide layer 202 is formed above a semiconductor substrate 200 using, for example, thermal oxidation at a temperature between about 600° C. and about 1250° C. Buffer oxide layer 202 may be, for example, a silicon dioxide layer having a thickness between about 0.01 µm and about 5 µm.

Then, a polishing stop layer 204, for example, a polysilicon layer or a silicon nitride layer having a thickness between about 0.05 µm and about 5 µm, is deposited above the buffer oxide layer 202. Preferably, the thickness of the polishing stop layer is about 0.2 µm.

Thereafter, a mask oxide layer 206, which serves as an etching mask in subsequent processes, is deposited using chemical vapor deposition.

Figure 2B:
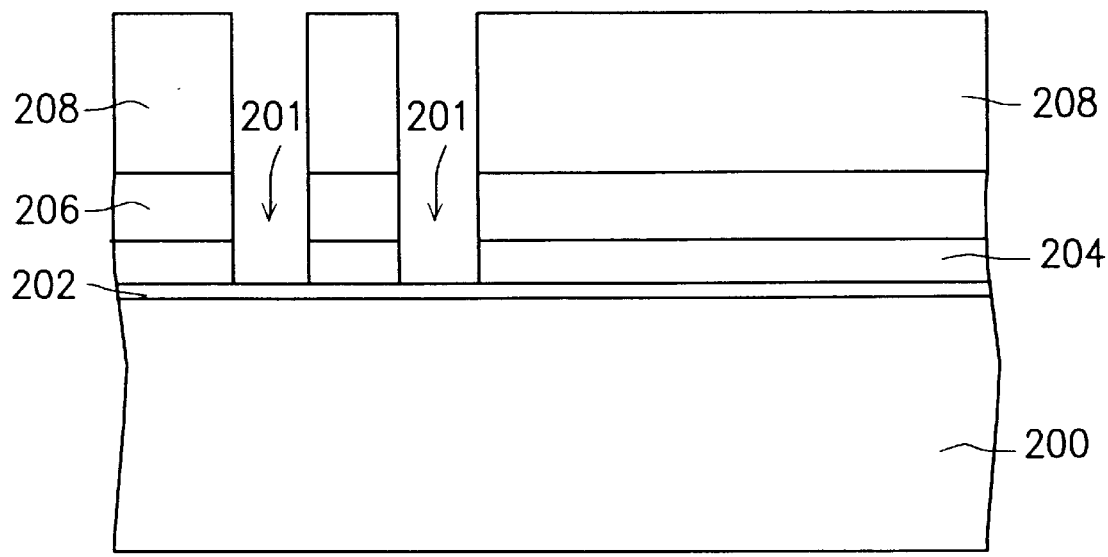

Referring to FIG. 2B, using photolithographic and etching processes, a photoresist layer 208 is formed and patterned. Then, photoresist layer 208 is used to define the mask oxide layer 206 and the polishing stop layer 204, thereby forming at least one narrow opening 201 having a width which is smaller than about 1.0 µm.

Figure 2C:
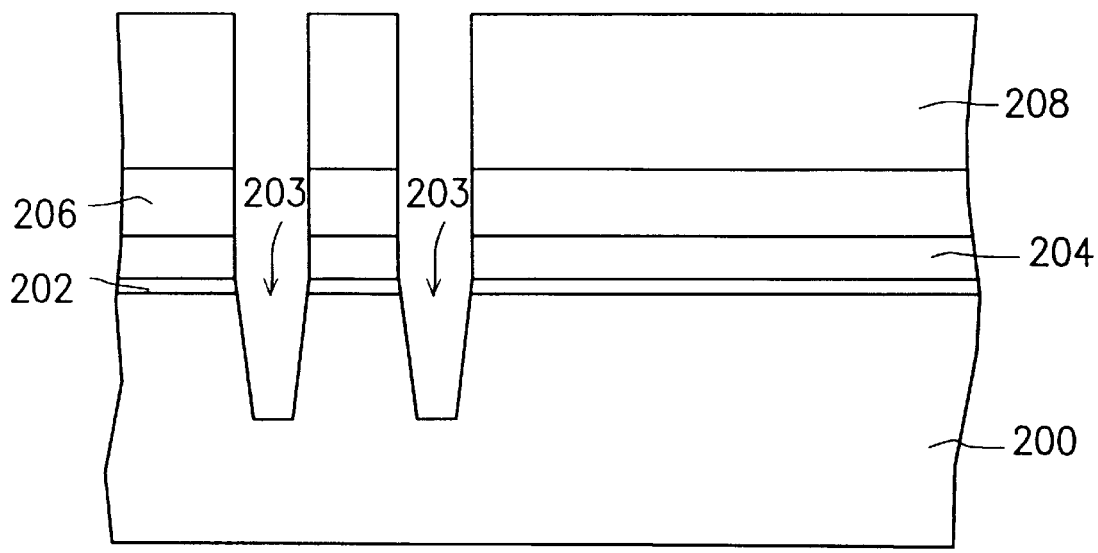

Referring to FIG. 2C, using the defined photoresist layer 208 and the mask oxide layer 206 as an etching mask, the buffer oxide layer 202 and the semiconductor substrate 200 are defined through the narrow opening 201, to form at least one narrow trench 203 in the semiconductor substrate 200. The depth of the trench 203 is greater than about 0.6 µm, for example, it may be about 0.7 µm.

Figure 2D:
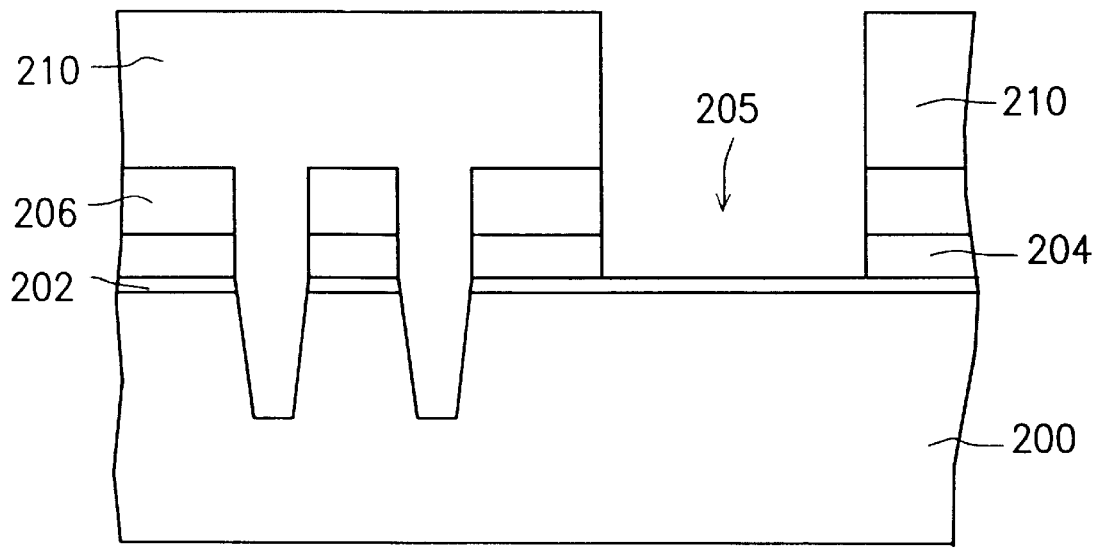

Referring to FIG. 2D, and again using photolithographic and etching processes, a photoresist layer 210 is formed and patterned. Photoresist layer 210 is used to define the mask oxide layer 206 and the polishing stop layer 204, thereby forming at least one wide opening 205. Wide opening 205 has a width which is larger than about 1.0 µm, for it may be example, 1.2 µm.

Figure 2E:
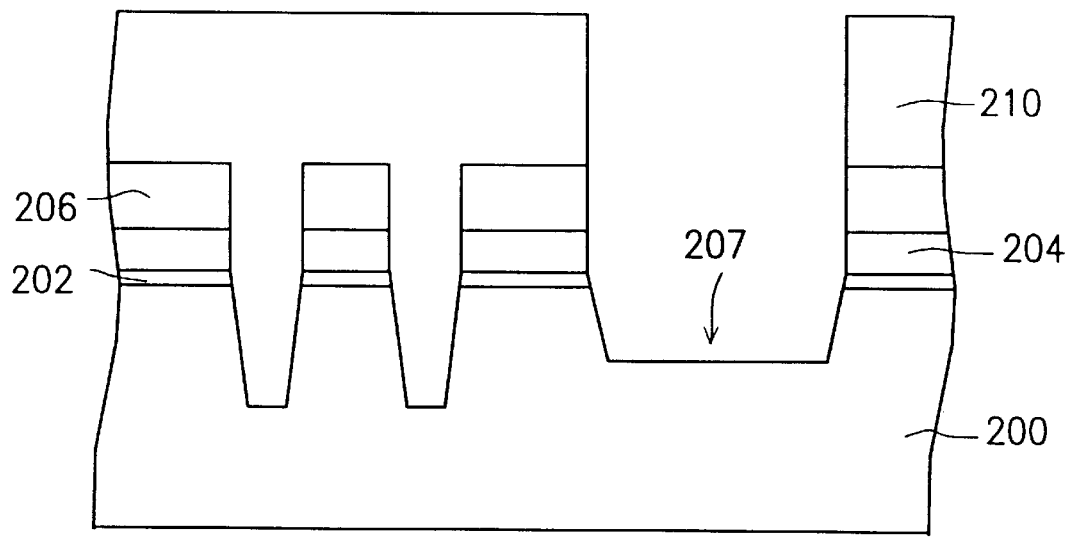

Referring to FIG. 2E, using the photoresist layer 210 and the mask oxide layer 206 as an etching mask, the buffer oxide layer 202 and the semiconductor substrate 200 are defined though the wide opening 205. This forms at least one wide trench 207. The depth of wide trench 207 is smaller than the depth of the narrow trench 203, for example, smaller than about 0.6 µm.

Figure 1A:
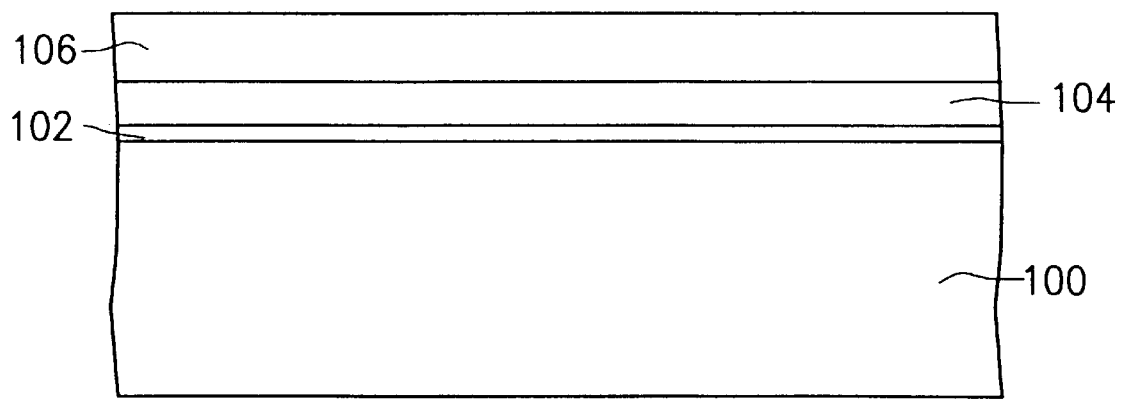
FIGS. 1A through 1E are cross-sectional views of a conventional process for forming a trench isolation region.
Figure 1B:
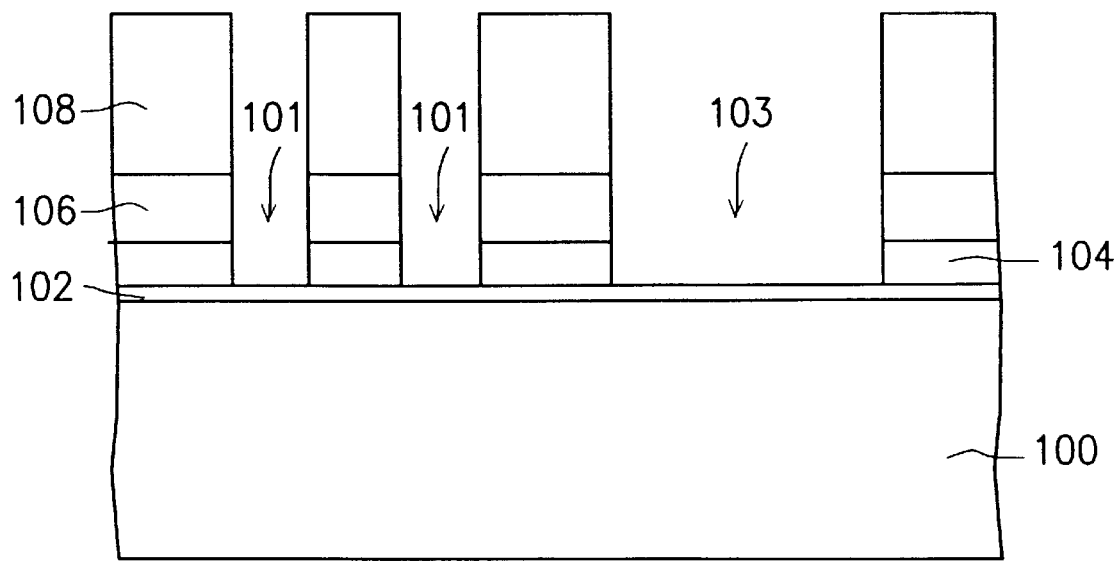
Figure 1C:
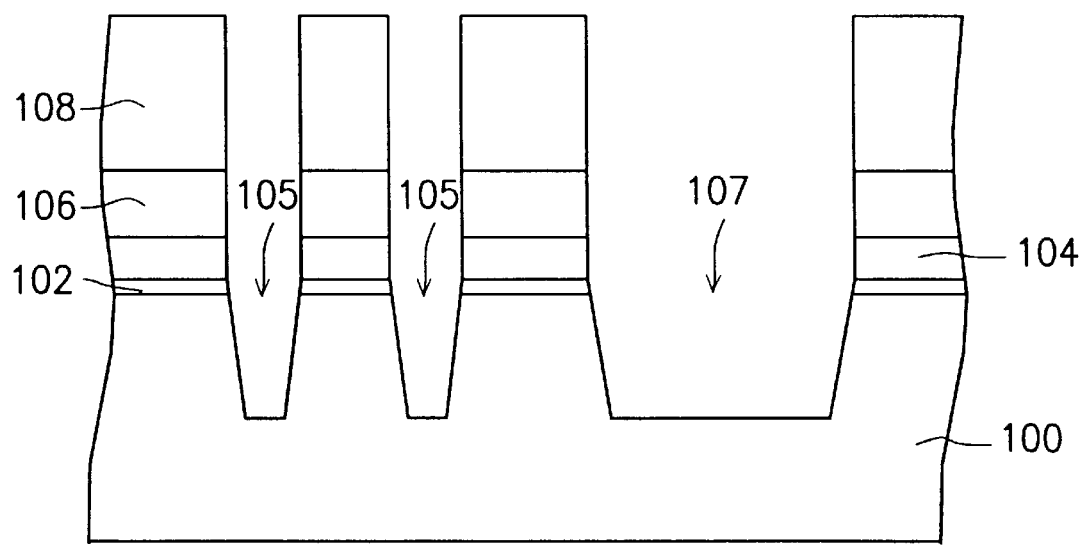
Figure 1D:
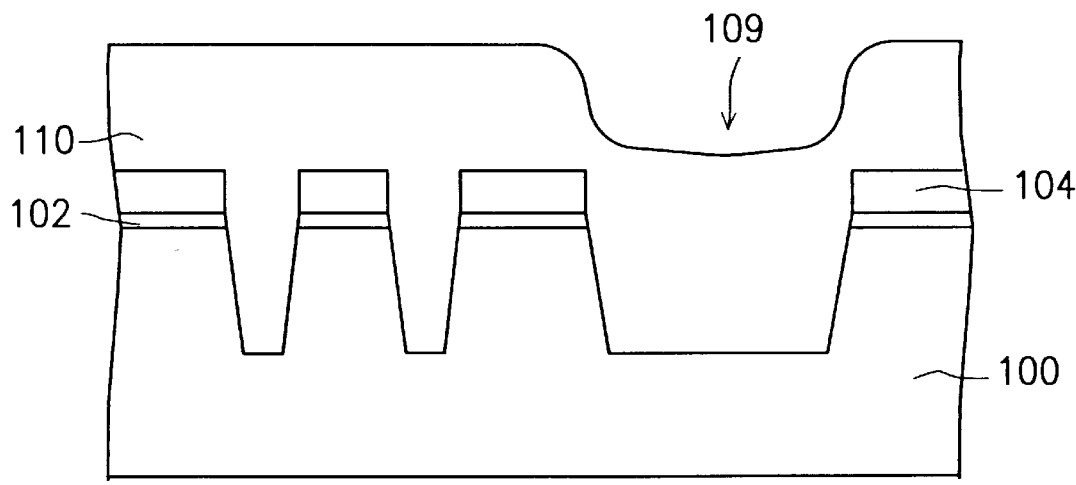
Figure 1E:
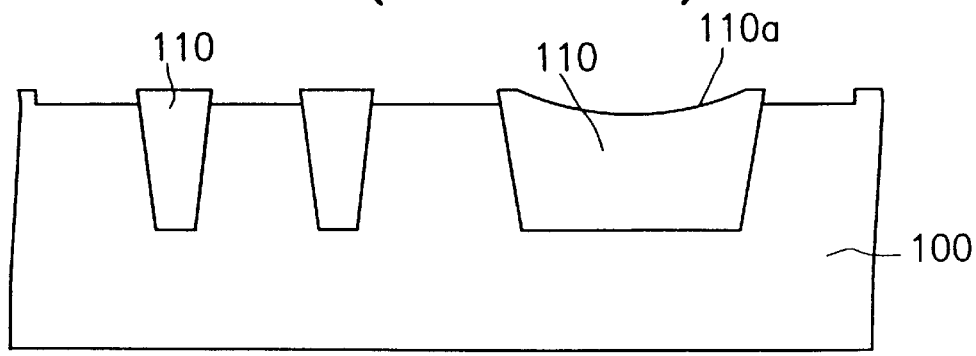
Figure 2F:
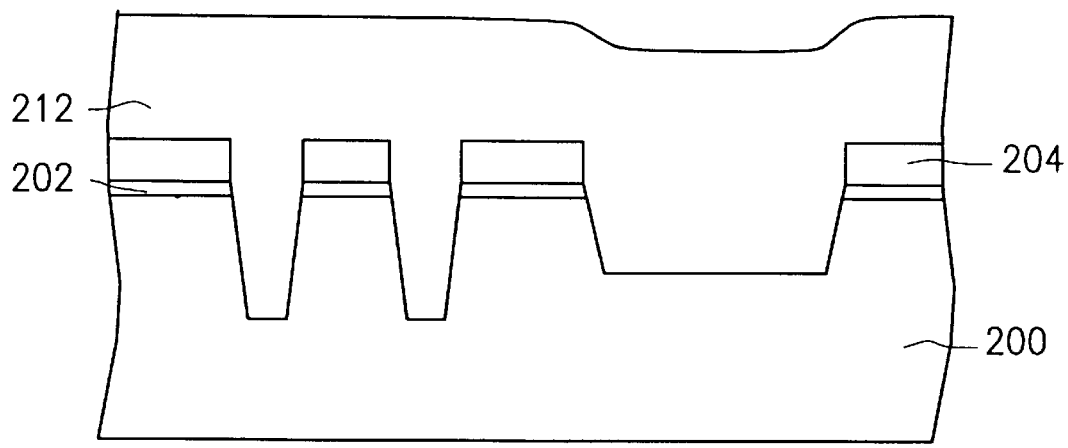

Referring to FIG. 2F, the photoresist layer 210 and the mask oxide layer 206 are removed. Then, an oxide layer 212 is formed, which fills the narrow trench 203 and the wide trench 207. Oxide layer 212 can be a silicon dioxide layer formed by performing, for example, a sub-atmospheric chemical vapor deposition (SACVD) method, using tetraethyl-ortho-silicate (TEOS)/ozone ($O_3$) as the main reactive gases. Because the depth of the wide trench 207 is shallower than the conventionally-made wide trench, no serious pit formations, such as the pit 109 shown in FIG. 1D, will occur in the surface of the oxide layer 212 above the wide trench 207. In fact, the step height of the oxide layer 212 above the wide trench 207 is roughly the same as the step height above the narrow trench 203.

Figure 2G:
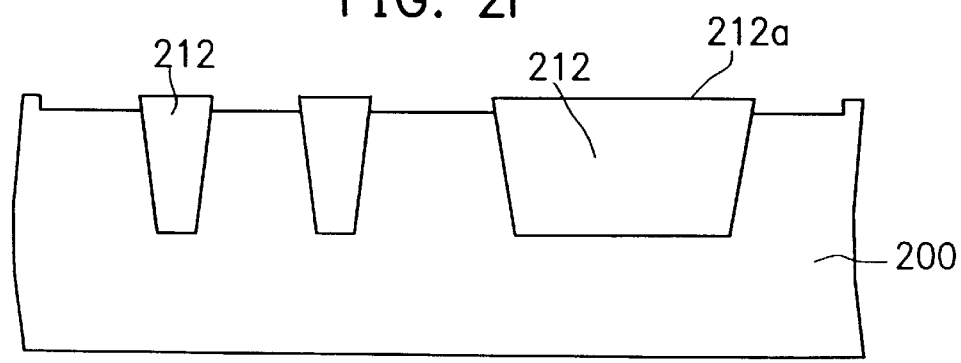

Referring to FIG. 2G, a planarization operation is performed (using CMP) to remove a portion of the oxide layer 212 and a portion of the polishing stop layer 204. This forms a surface 212a of oxide layer 212, formed above the wide trench 207, as a smooth planar surface without any dishing.

Finally, the remaining portions of the polishing stop layer 204 and buffer oxide layer 202 are removed to complete the trench isolation region.

In summary, the method of forming a trench isolation region, according to this invention, has at least the following advantages:

1. Due to the use of a multi-trench technique (that is, using a shallower depth for the wider trench compared to the narrower trench), there is no dishing of the insulating layer after performing the CMP operation. A smooth, planarized surface offers great benefits to subsequent manufacturing processes.

2. There is no need to increase the thickness of the insulating layer to counteract the problems caused by dishing, as in the conventional method. Therefore, deposition time is reduced and productivity is increased.

3. Reducing the thickness of the insulating layer helps reduce micro-particle pollution in the reaction chamber and on the surfaces of the wafers. Hence, machine stability is enhanced.

4. As a result of the thinner insulating layer, uniformity of the insulating layer can be more effectively controlled.

While the invention has been described by way of example and in terms of the preferred embodiment, it is to be understood that the invention is not limited to the disclosed embodiment. In accordance with the spirit of this invention, various modifications and changes may be made without departing from the sprit and scope of the invention. For example, although in the above embodiment described the narrow trenches are etch-defined first, followed by the etch-definition of the wide trenches, to form the shallower, wide trenches, the alternative may also occur. For example, the wide trenches may be etch-defined first, followed by etch-defined of the narrow trenches. Moreover, the present invention is intended to cover various other modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of forming a trench isolation region, comprising:

forming, in sequence, a buffer oxide layer and a polishing stop layer above a semiconductor substrate;

defining, in a first operation, the polishing stop layer, the buffer oxide layer and the semiconductor substrate to form at least one first trench;

defining, in a second operation, the polishing stop layer, the buffer oxide layer and the semiconductor substrate to form at least one second trench, wherein the first trench and the second trench have different widths, and wherein a wider of the trenches has a depth which is shallower than a depth of a narrower of the trenches;

filling the first trench and the second trench with an oxide layer;

removing a portion of the oxide layer and a portion of the polishing stop layer, using chemical-mechanical polishing, to form a planarized surface; and removing the buffer oxide layer and a remainder of the polishing stop layer.

2. The method according to claim 1, wherein said defining, in a second operation, includes forming the second trench with a width that is greater than the width of the first trench.

3. The method according to claim 2, wherein said defining, in a first operation, includes forming the first trench to a depth greater than about 0.6 μm.

4. The method according to claim 2, wherein said defining, in a second operation, includes forming the second trench with a width that is greater than about 1.0 μm, and a depth that is smaller than about 0.6 μm.

5. The method according to claim 1, wherein said defining, in a second operation, includes forming the second trench with a width that is narrower than the width of the first trench.

6. The method according to claim 5, wherein said defining, in a first operation, includes forming the first trench with a width that is greater than about 10 μm, and a depth that is smaller than about 0.6 μm.

7. The method according to claim 5, wherein said defining, in a second operation, includes forming the second trench to a depth greater than about 0.6 μm.

8. The method according to claim 1, wherein said forming includes using thermal oxidation, at a temperature between about 600° C. and about 1250° C., to form the buffer oxide layer.

9. The method according to claim 1, wherein said forming includes forming the buffer oxide layer to a thickness between about 0.01 μm and about 5 μm.

10. The method according to claim 1, wherein said forming includes comprising the polishing stop layer of a polysilicon.

11. The method according to claim 1, wherein said forming includes forming the polishing stop layer to a thickness between about 0.05 μm and about 5 μm.

12. The method according to claim 1, wherein said forming includes comprising the polishing stop layer of a silicon nitride.

13. The method according to claim 1, wherein said filling includes using sub-atmospheric vapor deposition to form the oxide layer.

14. The method according to claim 1, wherein said filling includes using tetra-ethyl-ortho-silicate/ozone as reactive gases to form the oxide layer.

15. A method of forming a trench isolation region, comprising:

forming, in sequence, a buffer oxide layer, a polishing stop layer and a mask oxide layer, above a semiconductor substrate;

defining, in a first operation, the mask oxide layer, the polishing stop layer, the buffer oxide layer and the semiconductor substrate to form at least one first trench;

defining, in a second operation, the mask oxide layer, the polishing stop layer, the buffer oxide layer and the semiconductor substrate to form at least one second trench, wherein the first trench and the second trench have different widths, and wherein a wider of the trenches has a depth which is shallower than a depth of a narrower of the trenches;

removing the mask oxide layer;

filling the first trench and the second trench with an oxide layer;

removing a portion of the oxide layer and a portion of the polishing stop layer, using chemical-mechanical polishing, to form a planarized surface; and removing the buffer oxide layer and a remainder of the polishing stop layer.

16. The method according to claim 15, wherein said defining, in a second operation, includes forming the second trench with a width that is greater than the width of the first trench.

17. The method according to claim 16, wherein said defining, in a first operation, includes forming the first trench to a depth greater than about 0.6 μm.

18. The method according to claim 16, wherein said defining, in a second operation, includes forming the second trench with a width that is greater than about 1.0 μm, and a depth that is smaller than about 0.6 μm.

19. The method according to claim 15, wherein said defining, in a second operation, includes forming the second trench with a width that is narrower than the width of the first trench.

20. The method according to claim 19, wherein said defining, in a first operation, includes forming the first trench with a width that is greater than about 1.0 μm, and a depth that is smaller than about 0.6 μm.

21. The method according to claim 19, wherein said defining, in a second operation, includes forming the second trench to a depth greater than about 0.6 μm.

22. The method according to claim 15, wherein said forming includes using thermal oxidation, at a temperature between about 600° C. and about 1250° C., to form the buffer oxide layer.

23. The method according to claim 15, wherein said forming includes forming the buffer oxide layer to a thickness between about 0.01 μm and about 5 μm.

24. The method according to claim 15, wherein said forming includes comprising the polishing stop layer of a polysilicon.

25. The method according to claim 15, wherein said forming includes forming the polishing stop layer to a thickness between about 0.05 μm and about 5 μm.

26. The method according to claim 15, wherein said forming includes comprising the polishing stop layer of a silicon nitride.

27. The method according to claim 15, wherein said forming includes using chemical vapor deposition to form the mask oxide layer.

28. The method according to claim 15, wherein said filling includes using sub-atmospheric vapor deposition to form the oxide layer.

29. The method according to claim 15, wherein said filling includes using tetra-ethyl-ortho-silicate/ozone as reactive gases to form the oxide layer.

* * * * *